United States Patent
Yang et al.

(10) Patent No.: US 11,384,255 B2
(45) Date of Patent: Jul. 12, 2022

(54) POLISHING SLURRY COMPOSITION FOR STI PROCESS

(71) Applicant: KCTECH CO., LTD., Gyeonggi-do (KR)

(72) Inventors: Hae Won Yang, Seoul (KR); Jun Ha Hwang, Gyeonggi-do (KR); Jung Yoon Kim, Gyeonggi-do (KR); Kwang Soo Park, Gyeonggi-do (KR)

(73) Assignee: KCTECH CO., LTD., Gyeonggi-Do (KR)

(*) Notice: Subject to any disclaimer, the term of this patent is extended or adjusted under 35 U.S.C. 154(b) by 101 days.

(21) Appl. No.: 16/954,350

(22) PCT Filed: Nov. 13, 2018

(86) PCT No.: PCT/KR2018/013763
§ 371 (c)(1),
(2) Date: Jun. 16, 2020

(87) PCT Pub. No.: WO2019/124741
PCT Pub. Date: Jun. 27, 2019

(65) Prior Publication Data
US 2021/0079262 A1    Mar. 18, 2021

(30) Foreign Application Priority Data
Dec. 20, 2017 (KR) .......... 10-2017-0176074

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
CPC ....................................... C09G 1/02
See application file for complete search history.

(56) References Cited

U.S. PATENT DOCUMENTS

| | | | |
|---|---|---|---|
| 6,824,579 B2 | 11/2004 | Ronay | |
| 2003/0228762 A1 | 12/2003 | Moeggenborg et al. | |
| 2007/0175104 A1 | 8/2007 | Nishiyama et al. | |
| 2009/0029633 A1 | 1/2009 | Carter et al. | |
| 2009/0047786 A1 | 2/2009 | Fukasawa et al. | |
| 2009/0093118 A1* | 4/2009 | Uotani ................. | C09K 3/1463 438/692 |
| 2017/0037278 A1 | 2/2017 | Masuda et al. | |

FOREIGN PATENT DOCUMENTS

| | | |
|---|---|---|
| CN | 1659249 A | 8/2005 |
| CN | 1746255 A | 3/2006 |
| CN | 101451047 A | 6/2009 |
| CN | 104272439 A | 1/2015 |
| CN | 104284960 A | 1/2015 |
| CN | 105308129 A | 2/2016 |
| KR | 20090084723 A | 8/2009 |
| KR | 20140059346 A | 5/2014 |
| KR | 20140133604 A | 11/2014 |

* cited by examiner

*Primary Examiner* — Thomas T Pham
(74) *Attorney, Agent, or Firm* — KDB Firm PLLC

(57) ABSTRACT

The present invention relates to a polishing slurry composition for an STI process, the polishing slurry composition comprising: a polishing solution including polishing particles; and an additive solution containing a nitride film polishing barrier inclusive of a polymer having an amide bond.

14 Claims, No Drawings

POLISHING SLURRY COMPOSITION FOR STI PROCESS

CROSS-REFERENCE TO RELATED APPLICATIONS

This application is a national phase claiming the benefit of and priority to International Patent Application No. PCT/KR2018/013763, entitled "POLISHING SLURRY COMPOSITION FOR STI PROCESS," filed Nov. 13, 2018, which claims priority to Korean Patent Application No. 10-2017-0176074, filed Dec. 20, 2017, which are hereby incorporated by reference in their entireties.

TECHNICAL FIELD

The present invention relates to a polishing slurry composition for a shallow trench isolation (STI) process, and more particularly, to a polishing slurry composition for an STI process that has an excellent polishing stop function.

BACKGROUND ART

With diversification and high integration of semiconductor devices, technologies of forming finer patterns are used, and accordingly surface structures of semiconductor devices become more complicated and a step between surface films becomes greater. In manufacturing of semiconductor devices, a chemical mechanical polishing (CMP) process is used as planarization technology to remove a stepped portion of a specific film formed on a substrate. The CMP process is, for example, a process for removing an insulating film excessively formed for layer insulation, and is widely used as a process of planarizing an interlayer dielectric (ILD) and an insulating film for shallow trench isolation (STI) to insulate chips from each other and a process of forming a metal conductive film, for example, a wiring, a contact plug or a via contact.

An STI process introduces technology of cutting an isolation portion, forming a trench, depositing an oxide and then performing planarization through CMP. Here, a selective polishing characteristic of increasing a polishing rate of an oxide layer that is an insulating film and reducing a polishing rate of a nitride layer that is a diffusion barrier is required. In particular, even though excessive polishing is performed in a cell-type pattern, a loss on a nitride film needs to be reduced.

When a polishing selectivity excessively increases in the STI process, an oxide film embedded in a trench may be excessively polished, which may lead to dishing and a decrease in characteristics of a device. In particular, since a stepped portion between an active region and a field region in a device with an ultra-fine trench is caused by such a dishing issue, the dishing issue may have a significant adverse influence on a performance and reliability of the device.

DETAILED DESCRIPTION OF THE INVENTION

Technical Subject

The present invention is to solve the foregoing problems, and an aspect of the present invention is to provide a polishing slurry composition for a shallow trench isolation (STI) process which may have a high polishing rate of an insulating film, may have a high polishing selectivity and a polishing stop function by inhibiting polishing of a nitride film, and may function to inhibit dishing after polishing during excessive polishing of a pattern wafer.

However, the problems to be solved in the present invention are not limited to the aforementioned problems, and other problems to be solved, which are not mentioned above, will be clearly understood by a person having ordinary skill in the art from the following description.

Technical Solution

According to an example embodiment of the present invention, a polishing slurry composition for an STI process includes a polishing solution including abrasive particles; and an additive solution including a nitride film polishing inhibitor including a polymer having an amide bond.

According to an aspect, the polymer may be represented by the following Chemical Formula 1:

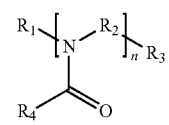

[Chemical Formula 1]

(wherein n is an integer greater than or equal to 1, $R_2$ is a simple bond and substituted or unsubstituted $C_{1-30}$ alkylene, alkenylene, cycloalkylene, arylene, arylalkylene or alkynylene, and $R_1$, $R_3$ and $R_4$ are each independently hydrogen, a hydroxyl group, $C_{1-30}$ alkyl group, alkoxy group, aryl group or aralkyl group in which a functional group is substituted or unsubstituted.)

According to an aspect, the polymer may include at least one selected from the group consisting of poly(2-methyl-2-oxazoline), poly(2-methyl-2-oxazoline) having a hydroxyl end, poly(2-methyl-2-oxazoline) having α-benzyl and ω-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and ω-thiol end, poly(2-ethyl-2-oxazoline) having α-methyl and ω-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

According to an aspect, a molecular weight of the polymer may be in a range of 1,000 to 5,000,000.

According to an aspect, the polymer may be present in an amount of 0.001% by weight (wt %) to 1 wt % in the polishing slurry composition for the STI process.

According to an aspect, the additive solution may further include an amine compound as an oxide film polishing regulator.

According to an aspect, the amine compound may further include at least one amine monomer selected from the group consisting of diethylenetriamine (DETA), triethylenetetramine (TETA), tetraethylenepenpentamine (TEPA), pentaethylenehexamine (PEHA), hexaethyleneheptamine (HEHA), bis(hexamethylene)triamine, N-(3-aminopropyl)ethylenediamine (Am3), N,N'-bis(3-aminopropyl) ethylenediamine (Am4), N,N,N'-tris(3-aminopropyl) ethylenediamine (Am5), N-3-aminopropyl-1,3-diaminopropane, N,N'-bis(3-aminopropyl)-1,3-diaminopropane, N,N,N'-tris(3-aminopropyl)-1,3-diaminopropane, bis-(3-aminopropyl)amine, dipropylenetriamine, and tripropylenetetramine; at least one amine polymer selected from the group consisting of poly(diethylenetriamine)-co-epichlorohydrin, poly(triethylenetetramine)-co-epichlorohydrin, tetraethylenepentamine (TEPA)-co-epichlorohydrin, and pentaethylenehexamine (PEHA)-co-epichlorohydrin; or a combination of both.

According to an aspect, the amine compound may be present in an amount of 0.1 part per million (ppm) to 1000 ppm in the polishing slurry composition for the STI process.

According to an aspect, the additive solution may further include at least one acidic material selected from the group consisting of carboxylic acid, nitric acid, hydrochloric acid, phosphoric acid, sulfuric acid, hydrofluoric acid, bromic acid, iodic acid, pimelic acid, malic acid, malonic acid, maleic acid, acetic acid, adipic acid, oxalic acid, succinic acid, tartaric acid, citric acid, lactic acid, glutaric acid, glycolic acid, formic acid, fumaric acid, propionic acid, butyric acid, hydroxybutyric acid, aspartic acid, itaconic acid, tricarballyic acid, suberic acid, benzoic acid, phenylacetic acid, naphthoic acid, mandelic acid, picolinic acid, nicotinic acid, isonicotinic acid, quinolinic acid, anthranilic acid, fumaric acid, phthalic acid, isophthalic acid, terephthalic acid, pyridinecarboxylic acid, salicylic acid, glutamic acid, polyacrylic acid, a polyacrylic acid copolymer, and polysulfonic acid.

According to an aspect, the additive solution may further include a basic material; and the basic material may include at least one selected from the group consisting of tetramethylammonium hydroxide, ammonia, potassium hydroxide, sodium hydroxide, magnesium hydroxide, rubidium hydroxide, cesium hydroxide, sodium hydrogen carbonate, sodium carbonate, arginine, histidine, lysine, methylamine, ethanolamine, propylamine, butylamine, isopropylamine, monoethanolamine, diethanolamine, triethanolamine, dipropylamine, ethylenediamine, propanediamine, triethylamine, tributylamine, tetramethylamine, triethylenetetramine, tetraethylenepentamine, N-methyldiethanolamine, N-propyldiethanolamine, N-isopropyldiethanolamine, N-(2-methylpropyl)diethanolamine, N-n-butyldiethanolamine, N-t-butylethanolamine, N-cyclohexyldiethanolamine, N,N-bis(2-hydroxypropyl)ethanolamine, triisopropanolamine, 2-amino-2-ethyl-1,3-propanediol, 2-dimethyl amino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, 3-amino-1-propanol, 2-amino-1-propanol, 1-amino-2-propanol, 1-amino-phentanol, 2-(dimethylamino)ethanol, 2-diethylaminoethanol, 2-dipropylaminoethanol, 2-butylaminoethanol, 2-t-butylaminoethanol, 2-cycloaminoethanol, 2-amino-2-phentanol, 2-[bis(2-hydroxyethyl)amino]-2-methyl-1-propanol, 2-[bis(2-hydroxyethyl)amino]-2-propanol, 2-amino-2-methyl-1-propanol, and tris(hydroxymethyl)aminomethane.

According to an aspect, the abrasive particles may be prepared using a solid-phase method or a liquid-phase method, and may be dispersed so that a surface of the abrasive particles may have positive charges.

According to an aspect, the abrasive particles may include at least one selected from the group consisting of a metal oxide, a metal oxide coated with an organic material or inorganic material, and the metal oxide in a colloidal phase. The metal oxide may include at least one selected from the group consisting of silica, ceria, zirconia, alumina, titania, barium titania, germania, mangania and magnesia.

According to an aspect, the abrasive particles may include a primary particle with a size of 5 nanometers (nm) to 150 nm and a secondary particle with a size of 30 nm to 300 nm.

According to an aspect, the abrasive particles may be present in an amount of 0.1 wt % to 10 wt % in the polishing slurry composition for the STI process.

According to an aspect, the polishing slurry composition for the STI process may have pH ranging from 3 to 6.

According to an aspect, the polishing slurry composition for the STI process may further include water, and a ratio of the polishing solution:the water:the additive solution may be 1:3 to 10:1 to 10.

According to an aspect, the polishing slurry composition for the STI process may have a zeta-potential of +5 millivolts (mV) to +70 mV.

According to an aspect, a polishing selectivity of an insulating film:a nitride film may range from 10:1 to 1000:1.

Effect of the Invention

By a polishing slurry composition for a shallow trench isolation (STI) process of the present invention, a high polishing rate of an insulating film layer and inhibition of polishing of a nitride film layer may be possible, thereby protecting a pattern nitride film layer. The polishing slurry composition may have a polishing stop function, thereby having a high selectivity. In particular, a loss on the nitride film layer may be reduced even though excessive polishing is performed. Also, a dishing amount of an insulating film may be reduced during polishing of a pattern wafer. Thus, the polishing slurry composition may be applied to an STI process of a semiconductor device, to enable manufacturing of a semiconductor device with better reliability and characteristics.

BEST MODE FOR CARRYING OUT THE INVENTION

Hereinafter, example embodiments of the present invention will be described in detail. When it is determined detailed description related to a related known function or configuration they may make the purpose of the present invention unnecessarily ambiguous in describing the present invention, the detailed description will be omitted here. Also, terminologies used herein are defined to appropriately describe the example embodiments and thus may be changed depending on a user, the intent of an operator, or a custom of a field to which the present invention pertains. Accordingly, the terminologies must be defined based on the following overall description of the present specification.

Throughout the specification, when any element is positioned "on" the other element, this not only includes a case that the any element is brought into contact with the other element, but also includes a case that another element exists between two elements.

Throughout the specification, if a prescribed part "includes" a prescribed element, this means that another element can be further included instead of excluding other elements unless any particularly opposite description exists.

Hereinafter, a polishing slurry composition for a shallow trench isolation (STI) process will be described in detail with reference to example embodiments. However, the present invention is not limited to the example embodiments.

A polishing slurry composition for an STI process according to an example embodiment of the present invention may include a polishing solution including abrasive particles; and an additive solution including a nitride film polishing inhibitor including a polymer having an amide bond.

By the polishing slurry composition for the STI process of the present invention, a high polishing rate of an insulating film layer and inhibition of polishing of a nitride film layer may be possible, thereby protecting a nitride film layer. The polishing slurry composition may have a polishing stop function, thereby having a high selectivity. In particular, a loss on the nitride film layer may be reduced even though excessive polishing is performed in a cell-type pattern. Also, a dishing amount of an insulating film may be reduced during polishing of a pattern wafer. Thus, the polishing slurry composition may be applied to an STI process of a semiconductor device, to enable manufacturing of a semiconductor device with better reliability and characteristics.

According to an aspect, the polymer may be represented by the following Chemical Formula 1:

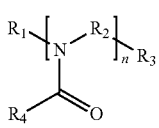

[Chemical Formula 1]

(wherein n is an integer greater than or equal to 1, R2 is a simple bond and substituted or unsubstituted $C_{1\text{-}30}$ alkylene, alkenylene, cycloalkylene, arylene, arylalkylene or alkynylene, and $R_1$, $R_3$ and $R_4$ are each independently hydrogen, a hydroxyl group, $C_{1\text{-}30}$ alkyl group, alkoxy group, aryl group or aralkyl group in which a functional group is substituted or unsubstituted.)

According to an aspect, the polymer may include at least one selected from the group consisting of poly(2-methyl-2-oxazoline), poly(2-methyl-2-oxazoline) having a hydroxyl end, poly(2-methyl-2-oxazoline) having α-benzyl and ω-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and end, poly(2-ethyl-2-oxazoline) having α-methyl and ω-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

According to an aspect, a molecular weight of the polymer may be in a range of 1,000 to 5,000,000. According to an aspect, the polymer may be present in an amount of 0.001% by weight (wt %) to 1 wt % in the polishing slurry composition for the STI process. When the amount of the polymer is less than 0.001 wt %, an automatic polishing stop function for a nitride film may not be implemented. When the amount of the polymer is greater than or equal to 1 wt %, residuals may remain due to insufficient polishing performed by a polymer network.

According to an aspect, the additive solution may further include an amine compound as an oxide film polishing regulator.

According to an aspect, the amine compound may further include at least one amine monomer selected from the group consisting of diethylenetriamine (DETA), triethylenetetramine (TETA), tetraethylenepenpentamine (TEPA), pentaethylenehexamine (PEHA), hexaethyleneheptamine (HEHA), bis(hexamethylene)triamine, N-(3-aminopropyl) ethylenediamine (Am3), N,N'-bis(3-aminopropyl) ethylenediamine (Am4), N,N,N'-tris(3-aminopropyl) ethylenediamine (Am5), N-3-aminopropyl-1,3-diaminopropane, N,N'-bis(3-aminopropyl)-1,3-diaminopropane, N,N,N'-tris(3-aminopropyl)-1,3-diaminopropane, bis-(3-aminopropyl) amine, dipropylenetriamine, and tripropylenetetramine; at least one amine polymer selected from the group consisting of poly(diethylenetriamine)-co-epichlorohydrin, poly(triethylenetetramine)-co-epichlorohydrin, tetraethylenepentamine (TEPA)-co-epichlorohydrin, and pentaethylenehexamine (PEHA)-co-epichlorohydrin; or a combination of both.

According to an aspect, the amine compound may be present in an amount of 0.1 part per million (ppm) to 1000 ppm in the polishing slurry composition for the STI process. When the amount of the amine compound is less than 0.1 ppm, dishing or defects may occur due to an extremely high oxide film polishing rate. When the amount of the amine compound exceeds 1000 ppm, polishing may be impossible.

According to an aspect, the additive solution may further include at least one acidic material selected from the group consisting of carboxylic acid, nitric acid, hydrochloric acid, phosphoric acid, sulfuric acid, hydrofluoric acid, bromic acid, iodic acid, pimelic acid, malic acid, malonic acid, maleic acid, acetic acid, adipic acid, oxalic acid, succinic acid, tartaric acid, citric acid, lactic acid, glutaric acid, glycolic acid, formic acid, fumaric acid, propionic acid, butyric acid, hydroxybutyric acid, aspartic acid, itaconic acid, tricarballyic acid, suberic acid, benzoic acid, phenylacetic acid, naphthoic acid, mandelic acid, picolinic acid, nicotinic acid, isonicotinic acid, quinolinic acid, anthranilic acid, fumaric acid, phthalic acid, isophthalic acid, terephthalic acid, pyridinecarboxylic acid, salicylic acid, glutamic acid, polyacrylic acid, a polyacrylic acid copolymer, and polysulfonic acid. The polyacrylic acid copolymer may include, for example, a polyacrylic acid-sulfonic acid copolymer, a polyacrylic acid-malonic acid copolymer, and a polyacrylic acid-polystyrene copolymer.

According to an aspect, the acidic material may be present in an amount of 0.001 wt % to 1 wt % in the polishing slurry composition for the STI process. When the amount of the acidic material in the polishing slurry composition for the STI process is less than 0.001 wt % or exceeds 1 wt %, a stability of a slurry composition may not be secured, so that a desired performance may not be achieved or defects may occur.

According to an aspect, the additive solution may further include a basic material; and the basic material may include at least one selected from the group consisting of tetramethylammonium hydroxide, ammonia, potassium hydroxide, sodium hydroxide, magnesium hydroxide, rubidium hydroxide, cesium hydroxide, sodium hydrogen carbonate, sodium carbonate, arginine, histidine, lysine, methylamine, ethanolamine, propylamine, butylamine, isopropylamine, monoethanolamine, diethanolamine, triethanolamine, dipropylamine, ethylenediamine, propanediamine, triethylamine, tributylamine, tetramethylamine, triethylenetetramine, tetraethylenepentamine, N-methyldiethanolamine, N-propyldiethanolamine, N-isopropyldiethanolamine, N-(2-methylpropyl)diethanolamine, N-n-butyldiethanolamine, N-t-butylethanolamine, N-cyclohexyldiethanolamine, N,N-bis (2-hydroxypropyl)ethanolamine, triisopropanolamine, 2-amino-2-ethyl-1,3-propanediol, 2-dimethyl amino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, 3-amino-1-propanol, 2-amino-1-propanol, 1-amino-2-propanol, 1-amino-phentanol, 2-(dimethylamino)ethanol, 2-diethylaminoethanol, 2-dipropylaminoethanol, 2-butylaminoethanol, 2-t-butylaminoethanol, 2-cycloaminoethanol, 2-amino-2-phentanol, 2-[bis(2-hydroxyethyl)amino]-2- methyl-1-propanol, 2-[bis(2-hydroxyethyl)amino]-2-propanol, 2-amino-2-methyl-1-propanol, and tris(hydroxymethyl)aminomethane.

According to an aspect, the basic material may be present in an amount of 0.01 wt % to 1 wt % in the polishing slurry composition for the STI process. When the amount of the basic material in the polishing slurry composition for the STI process is less than 0.01 wt % or exceeds 1 wt %, a stability of a slurry composition may not be secured, so that a desired performance may not be achieved or defects may occur.

According to an aspect, the abrasive particles may be prepared using a solid-phase method or a liquid-phase method, and may be dispersed so that a surface of the abrasive particles may have positive charges. The liquid-phase method, for example, a sol-gel method of causing a chemical reaction of abrasive particle precursors in an aqueous solution and of growing crystals to obtain minute particles, or a coprecipitation method of coprecipitating ions of abrasive particles in an aqueous solution, and a hydrothermal synthesis of forming abrasive particles under high-temperature and high-pressure conditions, may be applied to prepare abrasive particles. Also, the solid-phase method may be used to prepare abrasive particles by calcinating abrasive particle precursors at a temperature of 400° C. to 1,000° C.

According to an aspect, the abrasive particles may include at least one selected from the group consisting of a metal oxide, a metal oxide coated with an organic material or inorganic material, and the metal oxide in a colloidal phase. The metal oxide may include at least one selected from the group consisting of silica, ceria, zirconia, alumina, titania, barium titania, germania, mangania and magnesia. For example, the abrasive particles may be ceria dispersed with positive charges. The ceria dispersed with positive charges may be mixed with an additive solution activated with positive charges, thereby realizing a relatively high stepped portion removal performance and an automatic polishing stop function.

According to an aspect, the abrasive particles may include a primary particle with a size of 5 nanometers (nm) to 150 nm and a secondary particle with a size of 30 nm to 300 nm. An average particle size of the abrasive particles may be measured as an average value of particle sizes of a plurality of particles within a field of view which may be measured by a scanning electron microscope analysis or dynamic light scattering. The size of the primary particle may need to be less than or equal to 150 nm to ensure a particle uniformity. When the size of the primary particle is less than 5 nm, a polishing rate may decrease. When the size of the secondary particle in the polishing slurry composition for the STI process is less than 30 nm, and when small particles are excessively generated due to milling, cleanability may decrease, and an excess of defects may occur on a wafer surface. When the size of the secondary particle exceeds 300 nm, it may be difficult to adjust a selectivity due to excessive polishing, and dishing, erosion and surface defects may be likely to occur.

According to an aspect, the abrasive particles may be mixed particles with a multi-dispersion type particle distribution, in addition to a single-size particle. For example, abrasive particles with two different types of average particle sizes may be mixed to have a bimodal particle distribution, or abrasive particles with three different types of average particle sizes may be mixed to have a particle size distribution showing three peaks. Also, abrasive particles with at least four different types of average particle sizes may be mixed to have a multi-dispersion type particle distribution. Relatively large abrasive particles and relatively small abrasive particles may be mixed, to have a better dispersibility, and an effect of reducing scratches on a wafer surface may be expected.

*64 According to an aspect, the abrasive particles may be present in an amount of 0.1 wt % to 10 wt % in the polishing slurry composition for the STI process. When the amount of the abrasive particles in the polishing slurry composition for the STI process is less than 1 wt %, a polishing speed may decrease. When the amount of the abrasive particles exceeds 10 wt %, the polishing speed may significantly increase, and surface defects may occur due to adsorbability of particles remaining on a surface due to an increase in a number of abrasive particles.

According to an aspect, the polishing slurry composition for the STI process may have pH ranging from 3 to 6. When the pH is out of the above range, a dispersion stability may rapidly decrease and aggregation may occur.

According to an aspect, a process of preparing the polishing slurry composition for the STI process may include a concentration process and a dilution process. According to an aspect, the polishing slurry composition for the STI process may further include water; and a ratio of the polishing solution:the water:the additive solution may be 1:3 to 10:1 to 10. The water may include, for example, deionized water, ion-exchanged water and ultrapure water. In an example in which a proportion of the additive solution is in a range of 1 to 4, when the proportion of the additive solution decreases, the polishing slurry composition may be suitable for use in polishing of a bulk high-stepped portion. When the proportion of the additive solution increases within a range of 5 to 10, a polishing stop function of a nitride film may be enhanced, thereby effectively separating devices in the STI process.

According to an aspect, the polishing slurry composition may be provided in a two-liquid form in which a polishing solution and an additive solution are prepared separately and mixed immediately before polishing, and also be provided in a one-liquid form in which a polishing solution and an additive solution are mixed.

According to an aspect, the polishing slurry composition for the STI process may be a positive slurry composition that exhibits positive charges, and may have a zeta-potential of +5 millivolts (mV) to +70 mV. Due to positively charged abrasive particles, a high dispersion stability may be maintained so that the abrasive particles may not aggregate, thereby reducing an occurrence of micro-scratches.

According to an aspect, in the polishing slurry composition for the STI process, a polishing selectivity of an insulating film:a nitride film may range from 10:1 to 1000:1. The insulating film may have a polishing rate of 1,000 angstroms per minute (Å/min) to 10,000 Å/min, and the nitride film may have a polishing rate of 30 Å/min or less. More desirably, the polishing rate of the nitride film may be less than or equal to 10 Å/min. The polishing slurry composition for the STI process of the present invention may inhibit polishing on a surface of the nitride film by including a polymer having an amide bond, to have an automatic polishing stop function for the nitride film.

In other words, by the polishing slurry composition for the STI process of the present invention, a high polishing rate of an insulating film layer and inhibition of polishing of a nitride film layer may be possible, thereby protecting the nitride film layer. Also, a dishing amount of an insulating film may be reduced during polishing of a pattern wafer. Thus, the polishing slurry composition may be applied to an STI process of a semiconductor device, to enable manufacturing of a semiconductor device with better reliability and characteristics.

Hereinafter, the present invention will be described in detail based on examples.

However, the following examples are only for illustrating the present invention, and the present disclosure is not limited to the following examples.

Comparative Example 11

A polishing solution including ceria abrasive particles with a particle size of 150 nm was prepared.

0.01 wt % of tetraethylenepentamine as an amine compound, 0.002 wt % of poly(diethylenetriamine)-co-epichlorohydrin (DT-EH) as a polishing inhibitor, 0.08 wt % of histidine as a basic material, and 0.024 wt % of lactic acid as an acidic material were mixed, to prepare an additive solution with pH of 4.5.

The polishing solution, water and the additive solution were mixed at a ratio of 1:6:3, to prepare a polishing slurry composition for an STI process.

Comparative Example 2

A polishing solution including ceria abrasive particles with a particle size of 150 nm was prepared.

0.01 wt % of pentaethylenehexamine as an amine compound, 0.002 wt % of poly(diethylenetriamine)-co-epichlorohydrin (DT-EH) as a polishing inhibitor, 0.08 wt % of histidine as a basic material, and 0.024 wt % of lactic acid as an acidic material were mixed, to prepare an additive solution with pH of 4.5.

The polishing solution, water and the additive solution were mixed at a ratio of 1:6:3, to prepare a polishing slurry composition for an STI process.

Example 1

A polishing solution including ceria abrasive particles with a particle size of 150 nm was prepared.

0.05 wt % of tetraethylenepentamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 5.

The polishing solution, water and the additive solution were mixed at a ratio of 1:6:3, to prepare a polishing slurry composition for an STI process.

Example 2

A polishing solution including ceria abrasive particles with a particle size of 150 nm was prepared.

0.005 wt % of pentaethylenehexamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 5.

The polishing solution, water and the additive solution were mixed at a ratio of 1:6:3, to prepare a polishing slurry composition for an STI process.

Example 3

A polishing solution including ceria abrasive particles with a particle size of 150 nm was prepared.

0.005 wt % of pentaethylenehexamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 4.5.

The polishing solution, water and the additive solution were mixed at a ratio of 1:6:3, to prepare a polishing slurry composition for an STI process.

Example 4

A polishing solution including ceria abrasive particles with a particle size of 150 nm was prepared.

0.075 wt % of pentaethylenehexamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 5.

The polishing solution, water and the additive solution were mixed at a ratio of 1:6:3, to prepare a polishing slurry composition for an STI process.

Example 5

A polishing solution including ceria abrasive particles with a particle size of 150 nm was prepared.

0.01 wt % of pentaethylenehexamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 5.

The polishing solution, water and the additive solution were mixed at a ratio of 1:6:3, to prepare a polishing slurry composition for an STI process.

Example 6

A polishing solution including ceria abrasive particles with a particle size of 150 nm was prepared.

0.0125 wt % of pentaethylenehexamine as an amine compound, 0.1 wt % of poly(2-ethyl-2-oxazoline) as a polishing inhibitor, 0.08 wt % of histidine as a basic material, and 0.024 wt % of lactic acid as an acidic material were mixed, to prepare an additive solution with pH of 5.

The polishing solution, water and the additive solution were mixed at a ratio of 1:6:3, to prepare a polishing slurry composition for an STI process.

[Polishing Conditions]
1. Polishing machine: AP-300 (300 mm, manufactured by KCTECH)
2. Pad: IC 1000 (manufactured by DOW)
3. Polishing time: 60 sec
4. Platen RPM: 93 rpm
5. Spindle RPM: 87 rpm
6. Pressure: 4 psi
7. Flow rate: 250 ml/min
8. Wafer used: PE-TEOS 20 K (Å), SiN 2500 K (Å), STI SiN pattern wafer, a trench depth 1 K (Å)

Table 1 shows a removal rate (RR) of each of a nitride film (SiN) and an oxide film (TEOS) when a blanket wafer is polished using the polishing slurry compositions for the STI process of Examples 1 to 6 and Comparative Examples 1 and 2.

TABLE 1

| Classification | Formulation | | | | | 300 mm CMP | |
|---|---|---|---|---|---|---|---|
| | Polyamine | Acid | Base | Polymer | pH | TEOS RR (Å/min) | SiN RR (Å/min) |
| Comparative Example 1 | Tetraethylene pentamine 0.01% | LA 0.024% | HTD 0.08% | DT-EH 0.002% | 4.5 | 3381 | 22 |
| Comparative Example 2 | Pentaethylene hexamine 0.01% | LA 0.024% | HTD 0.08% | DT-EH 0.002% | 4.5 | 2293 | 18 |
| Example 1 | Tetraethylene pentamine 0.05% | LA 0.024% | HTD 0.08% | Poly(2-ethyl-2-oxazoline) 0.1% | 5 | 1930 | 11 |
| Example 2 | Pentaethylene hexamine 0.005% | LA 0.024% | HTD 0.08% | Poly(2-ethyl-2-oxazoline) 0.1% | 5 | 2817 | 10 |
| Example 3 | Pentaethylene hexamine 0.005% | LA 0.024% | HTD 0.08% | Poly(2-ethyl-2-oxazoline) 0.1% | 4.5 | 2071 | 8 |
| Example 4 | Pentaethylene hexamine 0.075% | LA 0.024% | HTD 0.08% | Poly(2-ethyl-2-oxazoline) 0.1% | 5 | 2132 | 8 |
| Example 5 | Pentaethylene hexamine 0.01% | LA 0.024% | HTD 0.08% | Poly(2-ethyl-2-oxazoline) 0.1% | 5 | 1485 | 8 |
| Example 6 | Pentaethylene hexamine 0.0125% | LA 0.024% | HTD 0.08% | Poly(2-ethyl-2-oxazoline) 0.1% | 5 | 1416 | 5 |

Referring to Table 1, it may be found that since poly(2-ethyl-2-oxazoline) was used as a polishing inhibitor in the polishing slurry composition for the STI process according to an example embodiment of the present invention, a polishing stop effect for a nitride film is excellent while maintaining an oxide film polishing rate even though a small amount of the amine compound is used, in comparison to when DT-EH was used in the comparative examples.

In other words, the polishing slurry composition for the STI process of the present invention may inhibit polishing on a surface of the nitride film by including a polishing inhibitor including a polymer having an amide bond, to have an automatic polishing stop function for the nitride film. In particular, a loss on the nitride film layer may be reduced even though excessive polishing is performed.

While a few example embodiments have been shown and described with reference, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits are combined or coupled in different forms and modes than as described above or be substituted or switched with other components or equivalents. Thus, other implementations, alternative embodiments and equivalents to the claimed subject matter are construed as being within the appended claims.

The invention claimed is:

1. A polishing slurry composition for a shallow trench isolation (STI) process, the polishing slurry composition comprising:
    a polishing solution comprising abrasive particles; and
    an additive solution comprising a nitride film polishing inhibitor comprising a polymer having an amide bond, further comprising water, wherein a ratio of the polishing solution:the water:the additive solution is 1:3 to 10:1 to 10,
    wherein a polishing selectivity of an insulating film:a nitride film ranges from 10:1 to 1000:1,
    wherein the polymer comprises at least one selected from the group consisting of poly(2-methyl-2-oxazoline), poly(2-methyl-2-oxazoline) having a hydroxyl end, poly(2-methyl-2-oxazoline) having α-benzyl and ω-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and ω-thiol end, poly(2-ethyl-2-oxazoline) having α-methyl and ω-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

2. The polishing slurry composition for the STI process of claim 1, wherein a molecular weight of the polymer is in a range of 1,000 to 5,000,000.

3. The polishing slurry composition for the STI process of claim 1, wherein the polymer is present in an amount of 0.001% by weight (wt %) to 1 wt % in additive solution.

4. The polishing slurry composition for the STI process of claim 1, wherein the additive solution further comprises an amine compound as an oxide film polishing regulator.

5. The polishing slurry composition for the STI process of claim 4, wherein the amine compound further comprises:
    at least one amine monomer selected from the group consisting of diethylenetriamine (DETA), triethylenetetramine (TETA), tetraethylenepenpentamine (TEPA), pentaethylenehexamine (PEHA), hexaethyleneheptamine (HEHA), bis(hexamethylene)triamine, N-(3-aminopropyl)ethylenediamine (Am3), N,N'-bis(3-aminopropyl) ethylenediamine (Am4), N,N,N'-tris(3-aminopropyl) ethylenediamine (Am5), N-3-aminopropyl-1,3-diaminopropane, N,N'-bis(3-aminopropyl)-1,3-diaminopropane, N,N,N'-tris(3-aminopropyl)-1,3- diaminopropane, bis-(3-aminopropyl)amine, dipropylenetriamine, and tripropylenetetramine;

at least one amine polymer selected from the group consisting of poly(diethylenetriamine)-co-epichlorohydrin, poly(triethylenetetramine)-co-epichlorohydrin, tetraethylenepentamine (TEPA)-co-epichlorohydrin, and pentaethylenehexamine (PEHA)-co-epichlorohydrin; or a combination of both.

6. The polishing slurry composition for the STI process of claim 4, wherein the amine compound is present in an amount of 0.1 part per million (ppm) to 1000 ppm in the additive solution.

7. The polishing slurry composition for the STI process of claim 1, wherein the additive solution further comprises at least one acidic material selected from the group consisting of carboxylic acid, nitric acid, hydrochloric acid, phosphoric acid, sulfuric acid, hydrofluoric acid, bromic acid, iodic acid, pimelic acid, malic acid, malonic acid, maleic acid, acetic acid, adipic acid, oxalic acid, succinic acid, tartaric acid, citric acid, lactic acid, glutaric acid, glycolic acid, formic acid, fumaric acid, propionic acid, butyric acid, hydroxybutyric acid, aspartic acid, itaconic acid, tricarballylic acid, suberic acid, benzoic acid, phenylacetic acid, naphthoic acid, mandelic acid, picolinic acid, nicotinic acid, isonicotinic acid, quinolinic acid, anthranilic acid, fumaric acid, phthalic acid, isophthalic acid, terephthalic acid, pyridinecarboxylic acid, salicylic acid, glutamic acid, polyacrylic acid, a polyacrylic acid copolymer, and polysulfonic acid.

8. The polishing slurry composition for the STI process of claim 1, wherein the additive solution further comprises a basic material; and the basic material comprises at least one selected from the group consisting of tetramethylammonium hydroxide, ammonia, potassium hydroxide, sodium hydroxide, magnesium hydroxide, rubidium hydroxide, cesium hydroxide, sodium hydrogen carbonate, sodium carbonate, arginine, histidine, lysine, methylamine, ethanolamine, propylamine, butylamine, isopropylamine, monoethanolamine, diethanolamine, triethanolamine, dipropylamine, ethylenediamine, propanediamine, triethylamine, tributylamine, tetramethylamine, triethylenetetramine, tetraethylenepentamine, N-methyldiethanolamine, N-propyldiethanolamine, N-isopropyldiethanolamine, N-(2-methylpropyl)diethanolamine, N-n-butyldiethanolamine, N-t-butylethanolamine, N-cyclohexyldiethanolamine, N,N-bis (2-hydroxypropyl)ethanolamine, triisopropanolamine, 2-amino-2-ethyl-1,3-propanediol, 2-dimethyl amino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, 3-amino-1-propanol, 2-amino-1-propanol, 1-amino-2-propanol, 1-amino-phentanol, 2-(dimethylamino)ethanol, 2-diethylaminoethanol, 2-dipropylaminoethanol, 2-butylaminoethanol, 2-t-butylaminoethanol, 2-cycloaminoethanol, 2-amino-2-phentanol, 2-[bis (2-hydroxyethyl)amino]-2-methyl-1-propanol, 2-[bis (2-hydroxyethyl)amino]-2-propanol, 2-amino-2-methyl-1-propanol, and tris(hydroxymethyl) aminomethane.

9. The polishing slurry composition for the STI process of claim 1, wherein the abrasive particles are prepared using a solid-phase method or a liquid-phase method, and are dispersed so that a surface of the abrasive particles has positive charges.

10. The polishing slurry composition for the STI process of claim 1, wherein the abrasive particles comprise at least one selected from the group consisting of a metal oxide, a metal oxide coated with an organic material or inorganic material, and the metal oxide in a colloidal phase, and the metal oxide comprises at least one selected from the group consisting of silica, ceria, zirconia, alumina, titania, barium titania, germania, mangania and magnesia.

11. The polishing slurry composition for the STI process of claim 1, wherein the abrasive particles comprise a primary particle with a size of 5 nanometers (nm) to 150 nm and a secondary particle with a size of 30 nm to 300 nm.

12. The polishing slurry composition for the STI process of claim 1, wherein the abrasive particles are present in an amount of 0.1 wt % to 10 wt % in the polishing solution.

13. The polishing slurry composition for the STI process of claim 1, wherein the polishing slurry composition for the STI process has pH ranging from 3 to 6.

14. The polishing slurry composition for the STI process of claim 1, wherein the polishing slurry composition for the STI process has a zeta-potential of +5 millivolts (mV) to +70 mV.

* * * * *